(12) United States Patent
Yoon et al.

(10) Patent No.: US 6,661,569 B2
(45) Date of Patent: Dec. 9, 2003

(54) SEMICONDUCTOR OPTICAL AMPLIFIER MODULE WITH MONITORING DEVICE

(75) Inventors: Young-Kwon Yoon, Anyang-shi (KR); Jeong-Seok Lee, Anyang-shi (KR)

(73) Assignee: Samsung Electronics Co, Ltd., Suwon (KR)

( * ) Notice: Subject to any disclaimer, the term of this patent is extended or adjusted under 35 U.S.C. 154(b) by 61 days.

(21) Appl. No.: 10/086,754

(22) Filed: Mar. 1, 2002

(65) Prior Publication Data

US 2003/0072076 A1 Apr. 17, 2003

(30) Foreign Application Priority Data

Oct. 12, 2001 (KR) .......................................... 2001-62883

(51) Int. Cl.$^7$ ............................... H01S 3/00; G02B 6/36
(52) U.S. Cl. ......................................... 359/333; 385/92
(58) Field of Search ................................. 359/333, 344; 385/92

(56) References Cited

U.S. PATENT DOCUMENTS

| | | | | |
|---|---|---|---|---|
| 4,995,696 A | * | 2/1991 | Nishimura et al. | ........ 350/96.2 |
| 6,366,396 B1 | * | 4/2002 | Hayashi | ...................... 359/344 |
| 6,384,961 B2 | * | 5/2002 | Lawrence | ................... 359/333 |

* cited by examiner

*Primary Examiner*—Mark Hellner
(74) *Attorney, Agent, or Firm*—Cha & Reiter

(57) ABSTRACT

The present invention discloses a semiconductor optical amplifier module with a monitoring device. The amplifier module includes a housing having a window on both sides of the opposite walls for forming a path of a first optical fiber and a second optical fiber, respectively; a semiconductor optical amplifier mounted in the housing for amplifying input optical signals and outputting the amplified optical signals; a first supporter for supporting the first optical fiber; a second supporter for supporting the second optical fiber; and a first optical detector for detecting non-coupled light, which is generated at the end of the first optical fiber.

10 Claims, 3 Drawing Sheets

SEMICONDUCTOR OPTICAL AMPLIFIER MODULE WITH MONITORING DEVICE

CLAIM OF PRIORITY

This application makes reference to and claims all benefits accruing under 35 U.S.C. Section 119 from an application entitled, "Semiconductor Optical Amplifier Module with Monitoring Device" filed in the Korean Industrial Property Office on Oct. 12, 2001 and there duly assigned Serial No. 2001-62883.

BACKGROUND OF THE INVENTION

1. Field of the Invention The present invention relates to optical communications devices and, more particularly, to an optical semiconductor module for optical amplification application.

2. Description of the Related Art

In general, an optical amplifier for use in optical communications is mainly divided into an optical-fiber amplifier and a semiconductor optical amplifier (SOA). An example of the optical-fiber amplifiers is erbium-doped optical-fiber amplifier (EDFA), in which a light source is pumped into an erbium-doped optical fiber so that the inputted optical signals are amplified through stimulated emission by the erbium element. In contrast, a commonly used semiconductor optical amplifier consists of layered structures formed on a semiconductor substrate in sequence, including an active layer with a multiple (or single) quantum well structure for a fiber amplification, a waveguide layer operable as a broadcast media of the inputted optical signals, a clad layer that encompasses the waveguide layer to confine the inputted optical signals therein, an upper electrode layer, and a lower electrode layer. It is well known that the semiconductor optical amplifier is more advantageous in that the level of the current applied to the upper electrode layer can be adjusted as occasion demands.

However, it is important to maintain a constant ratio between the inputted optical signal power and the outputted optical signal power (or an optical amplification ratio) in the semiconductor optical fiber. That is to say, if the optical amplification ratio of the semiconductor optical amplifier exceeds a threshold value, it can have a bad influence on the operation of other optical elements that are connected to the semiconductor optical amplifier. In addition, if the optical-amplification ratio of the semiconductor optical amplifier is smaller than the threshold value, it can deteriorate the characteristics of the outputted optical signals, such as the signal-to-noise ratio. As a result, a monitoring device is typically employed to ensure that optical characteristics are not affected by a discrepancy in the optical-amplification ratio.

FIG. 1 shows a monitoring device of a semiconductor optical amplifier according to the related art. As shown in FIG. 1, the monitoring device includes a semiconductor optical amplifier 110, a bean splitter 129, an optical detector 130, an analog/digital converter (ADC) 140, a bias circuit 150, a digital/analog converter (DAC) 160, and a controller 170.

The semiconductor optical amplifier 110 amplifies the inputted optical signals within a designated optical-amplification ratio, and outputs the amplified optical signals.

In operation, the beam splitter 120 splits a portion of the optical signals corresponding to x % of the total optical power outputted from the semiconductor optical amplifier 110 (hereinafter referred to as an optical signal sample), then outputs the optical signal sample to the optical detector 130. The other optical signal outputs corresponding to (100–x) % power are passed through the beam splitter 120. Meanwhile, the optical detector 130 converts the inputted optical-signal sample from the beam splitter 120 to electric signals and outputs the corresponding electric signals. The analog/digital converter 140 converts the output signals from the optical detector 130 to corresponding digital signals and outputs the converted digital signals to the controller 170. The controller 170 determines the power of the amplified optical signal that is outputted from the semiconductor optical amplifier 110 based on the digital signal outputs from the converter 140. In particular, the controller 170 obtains a difference between the amplified optical signal's power and a predetermined power threshold level, then adjusts the current level that is applied to the semiconductor optical amplifier 110 to adjust the optical amplification ratio of the semiconductor optical amplifier 110. Accordingly, the controller 170 outputs a control signal indicative of the adjusted current level to the digital/analog converter 160, which then converts the control signal to an analog signal and outputs the converted analog signal to the bias circuit 150. Finally, the bias circuit 150 applies the current responsive to the control signal to the semiconductor optical amplifier 110 to adjust the gain of the semiconductor optical amplifier 110. This change in the gain causes the optical amplification ratio of the semiconductor optical amplifier 110 to change. Accordingly, the controller 170 can control the optical-amplification ratio of the semiconductor optical amplifier 110 to maintain at a specific level.

There are some drawbacks in the prior art monitoring device in that it requires extra components, such as a beam splitter 120 for monitoring the outputted optical signal's power. As a result, it increases manufacturing costs. In addition, the semiconductor optical amplifier 110, the beam splitter 120, and the optical detector 130 must be positioned precisely in an array, and further require other devices (not shown) for the same application. Furthermore, the maximum output power of the semiconductor optical amplifier 110 suffers as a portion of the outputted optical signals are extracted during the monitoring operation.

In summary, the conventional structure of the semiconductor optical amplifier module that is mounted with the semiconductor optical amplifier and the monitoring device in a housing has drawbacks associated with high manufacturing cost, low integration due to the deployment of the beam splitter and additional optical components, and a loss in the maximum output power.

SUMMARY OF THE INVENTION

The present invention overcomes the above-described problems, and provides additional advantages by providing a semiconductor optical amplifier module with a monitoring device that has a low manufacturing cost, a high integration capability, and a maximum output power.

According to an aspect of the invention, there is provided a semiconductor optical amplifier with a monitoring device, which includes: a housing having a window on both sides of opposite walls for forming a path of a first optical fiber and a second optical fiber, respectively; a semiconductor optical amplifier fixated in the housing for amplifying the inputted optical signals and outputting the amplified optical signals; a first supporter for supporting the first optical fiber; and, a second supporter for supporting the second optical fiber.

According to another aspect of the invention, the semiconductor optical amplifier further includes a first optical detector that is arrayed in such a way to detect the non-coupled light generated in the line of the first optical fiber.

The foregoing and other features and advantages of the invention will be apparent from the following, more detailed description of preferred embodiments as illustrated in the accompanying drawings in which reference characters refer to the same parts throughout the various views. The drawings are not necessarily to scale, the emphasis instead is placed upon illustrating the principles of the invention.

BRIEF DESCRIPTION OF THE DRAWINGS

A more complete understanding of the method and apparatus of the present invention is available by reference to the following detailed description when taken in conjunction with the accompanying drawings wherein.

DETAILED DESCRIPTION OF THE PREFERRED EMBODIMENT

In the following description, for purposes of explanation rather than limitation, specific details are set forth such as the particular architecture, interfaces, techniques, etc., in order to provide a thorough understanding of the present invention. However, it will be apparent to those skilled in the art that the present invention may be practiced in other embodiments, which depart from these specific details. For purposes of simplicity and clarity, detailed descriptions of well-known devices, circuits, and methods are omitted so as not to obscure the description of the present invention with unnecessary detail.

Figure 1:
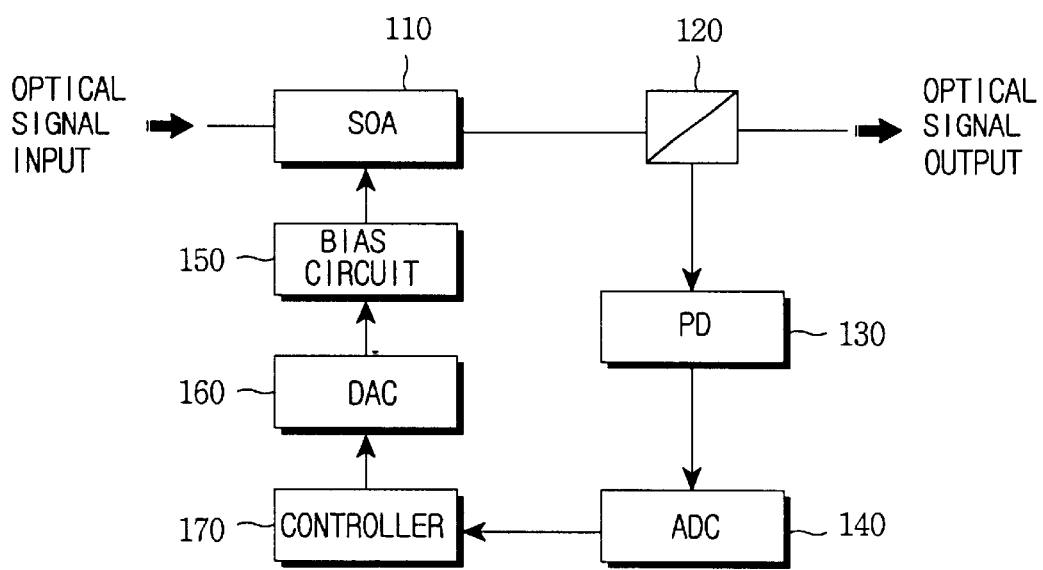
FIG. 1 shows a diagram explaining a monitoring device of a semiconductor optical amplifier according to a related art.
Figure 2:
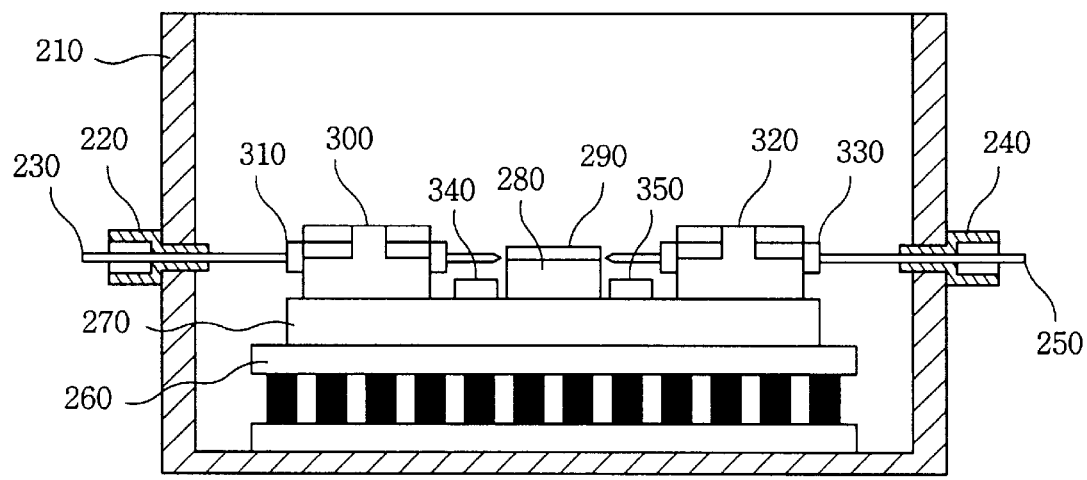
FIG. 2 illustrates a schematic sectional view showing a semiconductor optical amplifier with a monitoring device according to a preferred embodiment of the present invention; and, FIG. 3 schematically illustrates the monitoring process of the semiconductor optical amplifier depicted in FIG. 2.

FIG. 2 is a schematic sectional view of a semiconductor optical amplifier with a monitoring device in accordance with a preferred embodiment of the present invention. As shown in FIG. 1, the semiconductor optical amplifier module 200 includes a box-shaped housing 210, a thermoelectric cooling device 260, a substrate 270, a submount 280, a semiconductor optical amplifier 290, a first supporter 300 and 310, a second supporter 320 and 330, a first optical detector 340, and a second optical detector 350.

The housing 210 has the size of 20 mm×7 mm×7 mm and includes a plurality of electrodes (not shown) for receiving current and exchanging signals from an outer source. Formed on one sidewall of the housing 210 is a first window 220 for forming a pathway for a first optical fiber through which optical signals are inputted. On the other opposing side wall of the housing 210 is a second window 240 for forming a pathway for a second optical fiber 250 through which the amplified optical signals are outputted. Preferably, the first and the second windows 220 and 240 have a diameter of about 3 mm, respectively. Also, a preferable material for use for the first and the second optical fibers 230 and 250 is a single mode fiber tapered with a V-shaped edge.

The thermoelectric cooling device 270 has the size of 20 mm×7 mm×7 mm and is fixated on the bottom of the housing 210. Typically, the thermoelectric cooling device 270 is operated using the current supplied from the outer source. A major function of the thermoelectric cooling device 270 is to maintain a constant temperature in the semiconductor optical amplifier 290. The substrate 270 is fixably mounted on the upper surface of the thermoelectric cooling device 260 using a matrix made of InAg having a melting point of 130° C. Also, the substrate 270 can be made of kovar to facilitate laser welding. The submount 280 is fixably mounted on the upper surface of the substrate 270 using a matrix made of AuSn having a melting point of 280° C. The submount 280 is aligned in a straight line that connects the first window 220 to the second window 240.

The semiconductor optical amplifier 290 having a first cut-end and a second cut-end is fixably mounted on the upper side of the submount 280 using the same matrix material used for the submount, AuSn, having a melting point of 280° C., and amplifies the optical signals inputted through the first cut-end and outputs the amplified signals through the second cut-end. As a bi-directional optical device, the semiconductor optical amplifier 290 can amplify the optical signals inputted through the second cut-end and outputs the amplified signals through the first cut-end. The semiconductor optical amplifier 290 is formed by an approximately 1 mm-sized semiconductor substrate (not shown), which is made of a layered structure of an active layer having a multiple (or single) quantum well structure for a fiber amplification; a waveguide layer as a broadcast media for the inputted optical signals; a clad layer that encompasses the waveguide layer to confine the inputted optical signals; an upper electrode layer for receiving current from the outside, and a lower electrode layer. Note that the gain of the semiconductor optical amplifier 290 can be selectively changed by adjusting the current level that is supplied to the upper electrode layer from an external source.

The first supporter 300 and 310, including a first ferrule 310 and a first submodule 300, are mounted on the upper surface of the substrate 270. The first submodule 300 is preferably made of the same material as the substrate 270 and aligned along a straight line that connects the first cut end of the semiconductor optical amplifier 290 to the first window 220. The first ferrule 310 has a diameter of about 2.7 mm and is extended through the first submodule 300 using a laser welding technique. The first optical fiber 230 is inserted into a cylinder-shaped hole (not shown) mounted on the first ferrule 310. Here, one end of the first optical fiber 230 is disposed in the opposite end of the first cut-end of the semiconductor optical amplifier 290.

The first optical detector 340 is fixated on the upper surface of the substrate 270, interposed between the submount 280 and the first submodule 300. To detect the non-coupled light generated at the end of the first optical fiber 230, the first optical detector 340 is disposed in a straight line that connects the first cut end of the submount 280 with one end of the first optical fiber 230. A preferable material for the first optical detector 340 is a photodiode chip. Moreover, the first optical detector 340 is fixated on the upper surface of the substrate 270 using a matrix made of AuSn with a melting point at 280° C. The first optical detector 340 is operative to detect the non-coupled light, such as scattered light or bounce light that are usually generated by the incident optical signals on the linear cut-end of the first optical fiber 230, after the optical signals is first amplified by the semiconductor optical amplifier 290 and outputted through the first cut-end of the semiconductor optical amplifier 290. Another function of the first optical detector 340 is to output a first electric signal indicative of the power level of the non-coupled light.

The second supporter 320 and 330 includes a second ferrule 330 and a second submodule 320, and is fixated on the upper side of the substrate 270.

With a continued reference to FIG. 2, the second submodule 320 is made of the same material with the substrate 270 and positioned along a straight line connecting the second cut-end of the semiconductor optical amplifier 290 and the second window 240. Similar to the first ferrule 310, the second ferrule 330 has a diameter of about 2.7 mm and extended through the second submodule 320 using a laser welding technique. The second optical fiber 250 is inserted into a cylinder-shaped hole (not shown) mounted on the second ferrule 320. Note that one end of the second optical fiber 250 is disposed to be opposite the second cut-end of the semiconductor optical amplifier 290.

Again, similar to the first optical detector 340, the second optical detector 350 is fixated on the upper surface of the substrate 270, interposed between the submount 280 and the second submodule 320. To detect the non-coupled light generated at one end of the second optical fiber 250, the second optical detector 350 is positioned along a straight line that connects the second cut-end of the submount 280 to one end of the second optical fiber 250. A preferable material for the second optical detector 350 is a photodiode chip. The second optical detector 350 is mounted on the upper surface of the substrate 270 using a matrix made of AuSn having a melting point of 280° C. The second optical detector 350 is operative to detect the non-coupled light, such as scattered light or bounce light that are usually generated by the incidental optical signals on one end of the second optical fiber 250, after the optical signals are first amplified by the semiconductor optical amplifier 290 and outputted through the second cut-end of the semiconductor optical amplifier 290. Another function of the second optical detector 350 is to output a second electric signal indicative of the power level of the non-coupled light.

Figure 3:
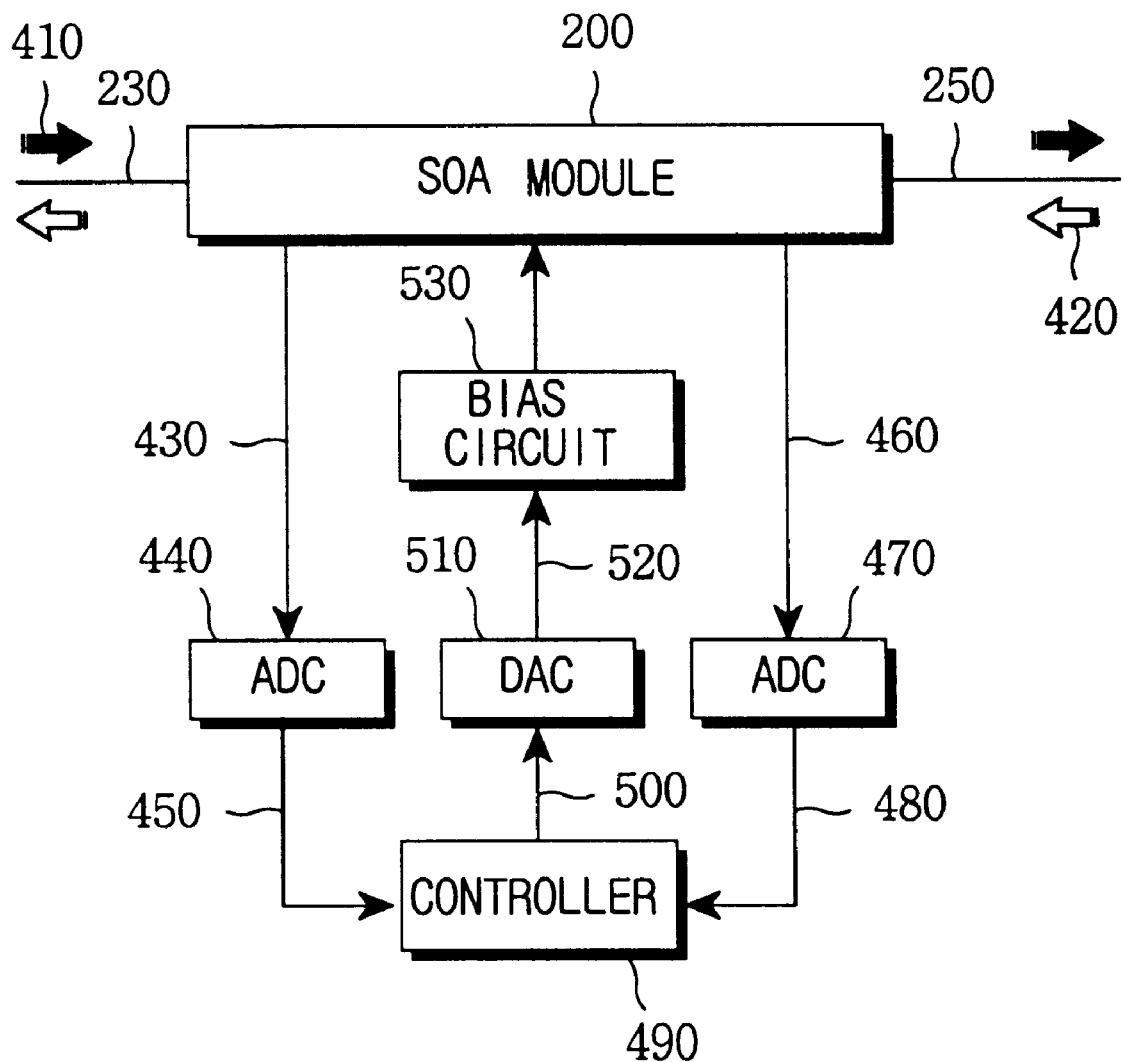

FIG. 3 is a schematic view explaining a monitoring procedure of the semiconductor optical amplifier module 200 shown in FIG. 2. As depicted in FIG. 3, there are a semiconductor optical amplifier module 200, a first analog/digital converter 440, a second analog/digital converter 470, a digital/analog converter 510, a bias circuit 530, and a controller 490. The semiconductor optical amplifier module 200 is a bi-directional optical device operative to amplify and output both the forward direction optical signal 410 and the reverse direction optical signal 420.

During the forward amplification process, the semiconductor optical amplifier module 200 outputs a first electric signal 460 indicative of the power level for the non-coupled light in respond to the forward optical signal 410 that has been inputted through the first optical fiber 230. The second analog/digital converter 470 converts the first electric signal 460 outputted from the semiconductor optical amplifier module 200 to a corresponding first digital signal 480, then outputs the digital signal 480 to the controller 490. Thereafter, the controller 490 determines the power level of the amplified forward optical signal 410 that has been outputted from the semiconductor optical amplifier module 200. More specifically, the controller 490 determines a difference between the pre-designated power and the power level of the amplified forward optical signal 410, then adjusts the level of the current applying to the semiconductor optical amplifier module 200 based on the power difference in order to maintain the optical amplification ratio of the semiconductor optical amplifier module 200 at a pre-designated optical-amplification ratio. As such, the controller 490 outputs a control signal 500 indicative of the required change in the current level to achieve the constant amplification ratio.

Meanwhile, the digital/analog converter 510 converts the control signal 500 to an analog signal 520 and outputs the analog signal 520 to the bias circuit 530. The bias circuit changes the optical amplification ratio of the semiconductor optical amplifier module 200 by applying the current according to the analog signal 520 received from the DAC 510. In summary, the controller 490 monitors the optical-amplification ratio of the semiconductor optical amplifier module 200 to control the optical-amplification ratio against the forward optical signal 410 to be in accord with the pre-designated value.

During the reverse amplification process, the semiconductor optical amplifier module 200 outputs a second electric signal 430 indicative of the power level of the non-coupled light in respond to the reverse optical signal 430 that has been inputted through the second optical fiber 250. The first analog/digital converter 440 converts the second electric signal 430 inputted from the semiconductor optical amplifier module 200 to a corresponding second digital signal 450 and outputs the digital signal to the controller 490.

Based on the second digital signal 450, the controller 490 determines the power level of the amplified reverse optical signal 410 that has been outputted from the semiconductor optical amplifier module 200. More specifically, the controller 490 determines the difference between the pre-designated power level and the power level of the amplified reverse optical signal 420, then adjusts the level of the current that is applied to the semiconductor optical amplifier module 200 to maintain the optical amplification ratio of the semiconductor optical amplifier module 200 at a pre-designated amplification ratio. Accordingly, the controller 490 outputs a control signal 500.

The digital/analog converter 510 converts the control signal 500 to an analog signal 520 and outputs the analog signal 820 to the bias circuit 530. Then, the bias circuit 530 changes the optical-amplification ratio of the semiconductor optical amplifier module 200 by applying the current according to the analog signal 520. As such, the controller 490 monitors the optical-amplification ratio of the semiconductor optical amplifier module 200 to control the optical amplification ratio against the forward optical signal 410 to be at a pre-designated value.

To conclude, the semiconductor optical amplifier module with the monitoring device according to the present invention detects the power level of the non-coupled light that is generated at one end of the first/second optical fiber using the photodiode chip, then determines the power level of the amplified forward or reverse optical signal. As a result, the inventive semiconductor optical amplifier module does not require an expensive beam splitter or a monitoring device that requires a precise disposition. Besides, as the monitoring procedure has no influence on the outputted optical signals, the semiconductor optical amplifier module of the present invention can be manufactured at a very low cost without compromising the maximum output power.

While the invention has been shown and described with reference to certain preferred embodiments thereof, it will be understood by those skilled in the art that various changes in form and details may be made therein without departing from the spirit and the scope of the invention as defined by the appended claims.

What is claimed is:

1. A semiconductor optical amplifier module having a monitoring device, comprising:
   a housing having an opening to form a path to receive an optical fiber there-through;
   a semiconductor optical amplifier having a first cut-end and a second cut-end mounted inside said housing for amplifying input optical signals received through said optical fiber;

at least one supporter mounted inside said housing for supporting said optical fiber therein; and, at least one optical detector disposed between one end of said optical fiber and said semiconductor optical amplifier for detecting non-coupled light generated from said one end of said optical fiber.

2. The optical amplifier module according to claim 1, further comprising:

a substrate mounted on a bottom surface of said housing; and a submount mounted on an upper surface of said substrate;

wherein said semiconductor optical amplifier is mounted on an upper surface of said submount, so that said input optical signals are amplified through said first cut-end and said amplified optical signals are outputted through said second cut-end.

3. The optical amplifier module according to claim 2, wherein said supporter is mounted on the upper surface of said substrate for supporting said optical fiber to make one end of said optical fiber be on the opposite end of said semiconductor optical amplifier.

4. The optical amplifier module according to claim 2, wherein said optical detector is mounted on the upper surface of said substrate and interposed between said submount and said supporter for detecting the non-coupled light that is generated at said one end of said optical fiber.

5. A semiconductor optical amplifier module having a monitoring device, comprising:

a housing having an opening at opposite ends of said housing to form a path to receive a first optical fiber and a second optical fiber, respectively;

a semiconductor optical amplifier having a first cut-end and a second cut-end mounted inside said housing for amplifying input optical signals received therein;

a first supporter mounted inside said housing for supporting said first optical fiber therein;

a second supporter mounted inside said housing for supporting said second optical fiber therein;

a first optical detector disposed between one end of said first optical fiber and said semiconductor optical amplifier for detecting non-coupled light generated from said one end of said first optical fiber; and, a second optical detector disposed between one end of said second optical fiber and said semiconductor optical amplifier for detecting non-coupled light generated from said one end of said second optical fiber.

6. The optical amplifier module according to claim 5, further comprising:

a substrate mounted on a bottom surface of said housing; and, a submount mounted on an upper surface of said substrate;

wherein said semiconductor optical amplifier is mounted on an upper surface of said submount, so that said input optical signals are amplified through said first cut-end and said amplified optical signals are outputted through said second cut end.

7. The optical amplifier module according to claim 6, wherein said first supporter is mounted on the upper surface of said substrate for supporting said first optical fiber to align in opposite end of said first cut-end of said semiconductor optical amplifier.

8. The optical amplifier module according to claim 6, wherein said second supporter is mounted on the upper surface of said substrate for supporting said second optical fiber to align in the opposite end of said second cut-end of said semiconductor optical amplifier.

9. The optical amplifier module according to claim 6, wherein said first optical detector is mounted on the upper surface of said substrate and interposed between said submount and said first supporter for detecting the non-coupled light that is generated at one end of said first optical fiber.

10. The optical amplifier module according to claim 6, wherein said second optical detector is mounted on the upper surface of said substrate and interposed between said submount and said second supporter for detecting the non-coupled light that is generated at one end of said second optical fiber.

* * * * *